United States Patent
Hattori et al.

(10) Patent No.: US 11,413,937 B2
(45) Date of Patent: Aug. 16, 2022

(54) CURRENT ESTIMATING DEVICE, ELECTRIC COMPRESSOR, CURRENT ESTIMATING METHOD, AND MOTOR CURRENT EFFECTIVE VALUE ESTIMATING METHOD

(71) Applicant: MITSUBISHI HEAVY INDUSTRIES THERMAL SYSTEMS, LTD., Tokyo (JP)

(72) Inventors: Makoto Hattori, Tokyo (JP); Hiroyuki Kamitani, Tokyo (JP); Hiroto Higuchi, Tokyo (JP); Masahiro Mori, Tokyo (JP); Kyohei Watanabe, Tokyo (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 416 days.

(21) Appl. No.: 16/632,797

(22) PCT Filed: Aug. 15, 2018

(86) PCT No.: PCT/JP2018/030363
§ 371 (c)(1),
(2) Date: Jan. 21, 2020

(87) PCT Pub. No.: WO2019/049625
PCT Pub. Date: Mar. 14, 2019

(65) Prior Publication Data
US 2021/0155080 A1    May 27, 2021

(30) Foreign Application Priority Data
Sep. 7, 2017   (JP) .............................. JP2017-171976

(51) Int. Cl.
*B60H 1/32* (2006.01)
*F04B 35/04* (2006.01)
(Continued)

(52) U.S. Cl.
CPC .......... *B60H 1/3225* (2013.01); *F04B 35/04* (2013.01); *F04B 49/06* (2013.01); *F04B 49/20* (2013.01);
(Continued)

(58) Field of Classification Search
CPC .......... F04B 35/04; F04B 39/06; F04B 39/20; F25B 49/025; G01R 19/16538; H02P 23/14
See application file for complete search history.

(56) References Cited

U.S. PATENT DOCUMENTS 11,146,201 B2 * 10/2021 Hattori .................... H02P 29/68
2002/0170305 A1  11/2002 Nakajima
(Continued)

FOREIGN PATENT DOCUMENTS

JP          2002-340423 A     11/2002

OTHER PUBLICATIONS

International Search Report for International Application No. PCT/JP2018/030363, dated Nov. 20, 2018, with English translation.
Written Opinion of the International Searching Authority for International Application No. PCT/JP2018/030363, dated Nov. 20, 2018, with English translation.

*Primary Examiner* — Patrick Hamo
(74) *Attorney, Agent, or Firm* — Birch, Stewart, Kolasch & Birch, LLP

(57) ABSTRACT

A current estimating device that estimates a capacitor current of a high-voltage circuit for driving a motor, wherein the current estimating device calculates a voltage utilization rate using the input voltage of an inverter included in the high-voltage circuit and the speed of the motor, calculates a first constant by applying the voltage utilization rate to a predetermined first arithmetic expression, and calculates the capacitor current of an electrical condenser included in the high-voltage circuit by multiplying the first constant by a motor current effective value.

9 Claims, 4 Drawing Sheets

(51) Int. Cl.
  *F04B 49/06* (2006.01)
  *F04B 49/20* (2006.01)
  *F25B 49/02* (2006.01)
  *G01R 19/165* (2006.01)
  *H02P 23/14* (2006.01)

(52) U.S. Cl.
  CPC ...... *F25B 49/025* (2013.01); *G01R 19/16538* (2013.01); *H02P 23/14* (2013.01); *B60H 2001/3292* (2013.01); *F04B 2203/0201* (2013.01); *F04B 2203/0202* (2013.01); *F25B 2500/19* (2013.01); *F25B 2600/021* (2013.01); *F25B 2700/151* (2013.01); *F25B 2700/171* (2013.01)

(56) References Cited

U.S. PATENT DOCUMENTS

| | | | |
|---|---|---|---|
| 2015/0211533 A1* | 7/2015 | Nagata | F04C 18/0207 318/369 |
| 2015/0311845 A1* | 10/2015 | Nagata | H02P 21/26 318/400.02 |
| 2016/0036359 A1* | 2/2016 | Nagata | H02P 29/68 318/400.1 |
| 2017/0279393 A1* | 9/2017 | Kawashima | B60H 1/3222 |
| 2018/0241333 A1* | 8/2018 | Sakai | H02P 21/18 |
| 2019/0052210 A1* | 2/2019 | Li | F25B 31/02 |
| 2022/0021318 A1* | 1/2022 | Tsumura | H02P 5/46 |

\* cited by examiner

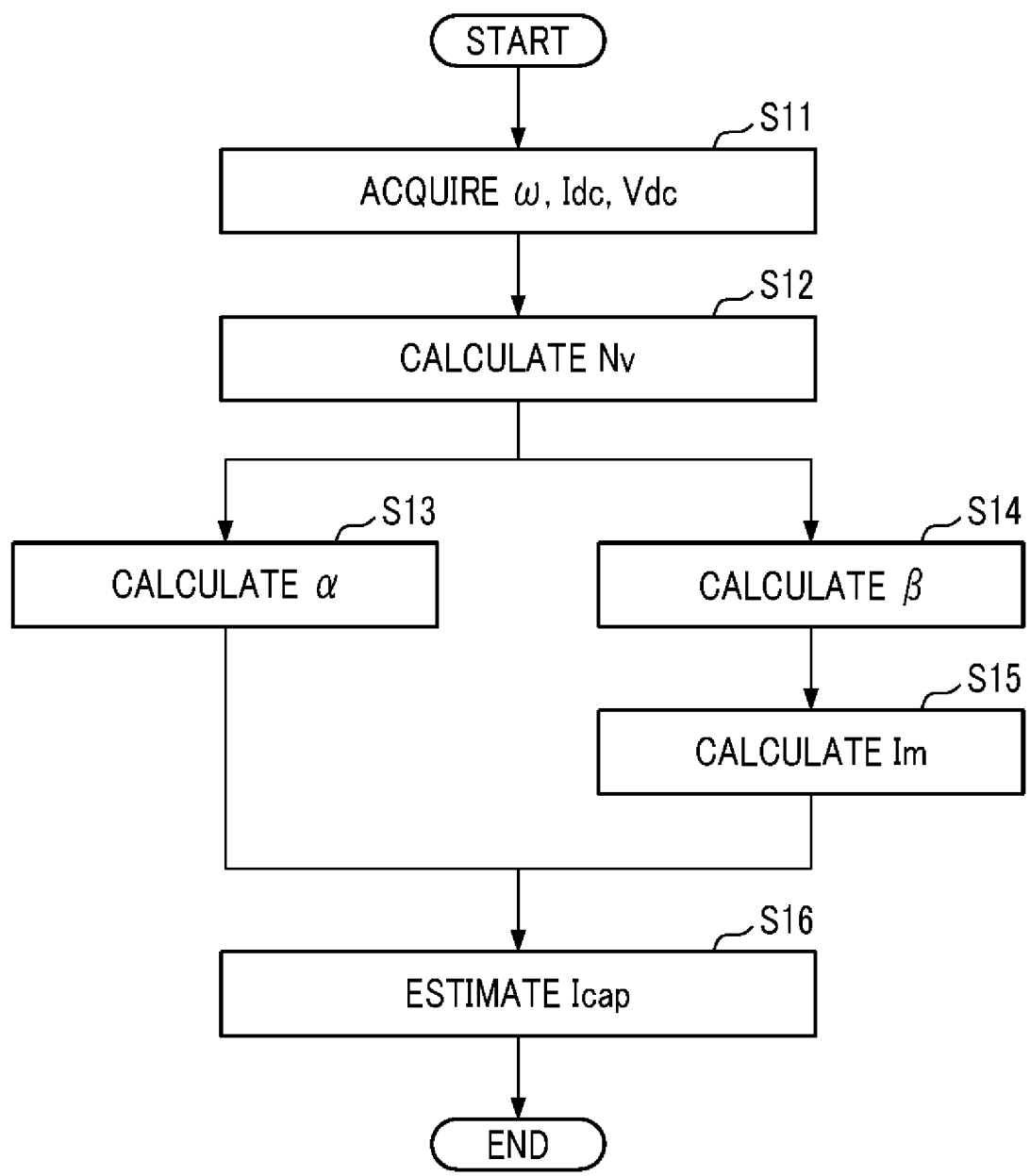

CURRENT ESTIMATING DEVICE, ELECTRIC COMPRESSOR, CURRENT ESTIMATING METHOD, AND MOTOR CURRENT EFFECTIVE VALUE ESTIMATING METHOD

TECHNICAL FIELD

The present invention relates to a current estimating device, an electric compressor, a current estimating method, and a motor current effective value estimating method.
Priority is claimed on Japanese Patent Application No. 2017-171976, filed Sep. 7, 2017, the content of which is incorporated herein by reference.

BACKGROUND ART

As a compressor for an air conditioner used in a car air conditioner, an inverter integrated electric compressor into which an inverter device is incorporated is provided. The electric compressor includes a high-voltage circuit for supplying high voltage power from a power supply unit mounted on a vehicle to a motor included in the electric compressor.
As a related technique, PTL 1 discloses a technique for preventing damage or the like caused by liquid compression in an electric compressor provided in a vehicle air conditioner, in which the damage is prevented by controlling a rotation speed based on a value of a current flowing through a motor when the electric compressor starts.

CITATION LIST

Patent Literature

[PTL 1] Japanese Unexamined Patent Application Publication No. 2002-340423

SUMMARY OF INVENTION

Technical Problem

For example, in a case of the above-described inverter integrated electric compressor, if a current of a capacitor set in the high-voltage circuit can be accurately estimated and ascertained, the compressor operation for preventing failure can be performed more appropriately. Therefore, a technique of estimating a capacitor current flowing through the capacitor is desired.
The present invention provides a current estimating device, an electric compressor, a current estimating method, and a motor current effective value estimating method capable of solving the above-described problems.

Solution to Problem

According to an aspect of the present invention, there is provided a current estimating device for estimating a capacitor current of a high-voltage circuit which drives a motor, the device including: a voltage utilization rate calculation unit which calculates a voltage utilization rate using an input voltage of an inverter included in the high-voltage circuit and a rotation speed of the motor; a first constant calculation unit which applies the voltage utilization rate to a predetermined first calculation expression to calculate a first constant; and a capacitor current calculation unit which multiplies the first constant by a motor current effective value of the motor to calculate a capacitor current of a capacitor included in the high-voltage circuit.

According to an aspect of the present invention, the first calculation expression is the following Equation (1) when n, A0, and Ai (i=1 to n) are predetermined constants, the first constant is α, and the voltage utilization rate is Nv.

$$\alpha = AO + \sum_{i=1}^{n}(Ai \times Nv^j) \quad (1)$$

According to an aspect of the present invention, the current estimating device further includes a second constant calculation unit which applies the voltage utilization rate to a predetermined second calculation expression to calculate a second constant; and a motor current effective value calculation unit which multiplies the second constant by an input current of the inverter to calculate the motor current effective value.

According to an aspect of the present invention, the second calculation expression is the following Equation (2) when m, B0, and Bj (j=1 to m) are predetermined constants, the second constant is β, and the voltage utilization rate is Nv.

$$\beta = BO + \sum_{j=1}^{m}(Bj \times Nv^j) \quad (2)$$

According to an aspect of the present invention, there is provided an electric compressor including the above-described current estimating device.

According to an aspect of the present invention, there is provided a current estimating method for estimating a capacitor current of a high-voltage circuit which drives a motor, the method including: a step of calculating a voltage utilization rate using an input voltage of an inverter included in the high-voltage circuit and a rotation speed of the motor; a step of applying the voltage utilization rate to a predetermined first calculation expression to calculate a first constant; and a step of multiplying the first constant by a motor current effective value of the motor to calculate a capacitor current of a capacitor included in the high-voltage circuit.

According to an aspect of the present invention, there is provided a motor current effective value estimating method for estimating a motor current effective value of a high-voltage circuit which drives a motor, the method including: a step of calculating a voltage utilization rate using an input voltage of an inverter included in the high-voltage circuit and a rotation speed of the motor; a step of applying the voltage utilization rate to a predetermined second calculation expression to calculate a second constant; and a step of multiplying the second constant by an input current of the inverter to calculate the motor current effective value.

Advantageous Effects of Invention

According to the current estimating device, the electric compressor, the current estimating method, and the motor current effective value estimating method, it is possible to accurately estimate the capacitor current of the capacitor provided in the high-voltage circuit which drives the motor.

BRIEF DESCRIPTION OF DRAWINGS

FIG. 4 is a flowchart showing an example of current estimation processing in the embodiment of the present invention.

DESCRIPTION OF EMBODIMENTS

Embodiment

Hereinafter, a current estimation processing of a capacitor current according to an embodiment of the present invention will be described with reference to FIGS. 1 to 4.

Figure 1:
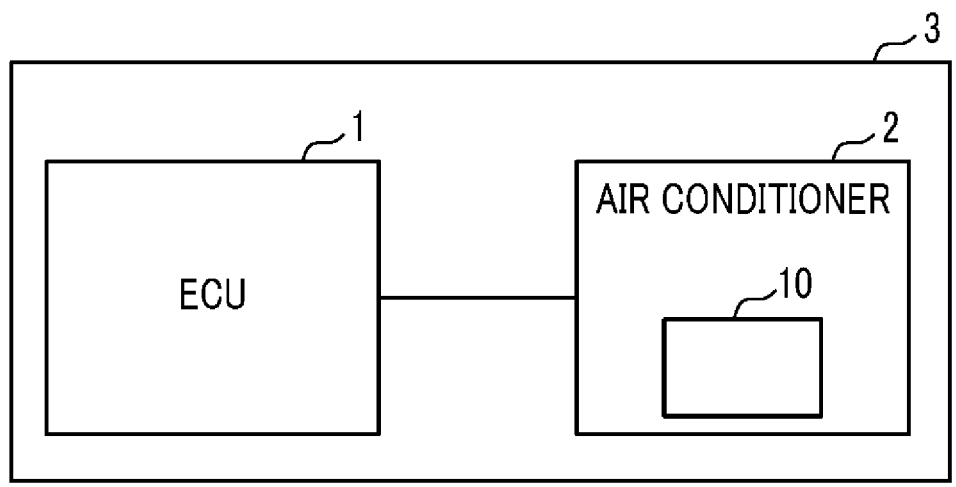
FIG. 1 is a schematic block diagram of a vehicle including an electric compressor in an embodiment of the present invention.

FIG. 1 is a schematic block diagram of a vehicle including an electric compressor in an embodiment of the present invention.

FIG. 1 shows an electric control unit (ECU) 1 and an in-vehicle air conditioner 2 included in a vehicle 3. As shown in FIG. 1, the vehicle 3 includes the ECU 1 and the air conditioner 2. The air conditioner 2 includes an electric compressor 10. The ECU 1 controls an electrical device of the vehicle 3. The air conditioner 2 is a car air conditioner unit. The electric compressor 10 is an electric compressor used in the in-vehicle air conditioner. The electric compressor 10 is an inverter integrated electric compressor into which an inverter device is integrally incorporated. The ECU 1 and the air conditioner 2 are connected to each other by a signal line, a communication line, a power line, or the like, and the air conditioner 2 receives a control signal of the ECU 1 through a controller area network (CAN) communication. Moreover, when a user performs an operation such as starting, stopping, and temperature setting on the air conditioner, the ECU 1 generates a control signal corresponding to the operation and controls an operation of the air conditioner 2. The electric compressor 10 incorporated into the air conditioner 2 is also operated based on the control signal generated by the ECU 1. Next, the electric compressor 10 and a control circuit thereof will be described.

Figure 2:
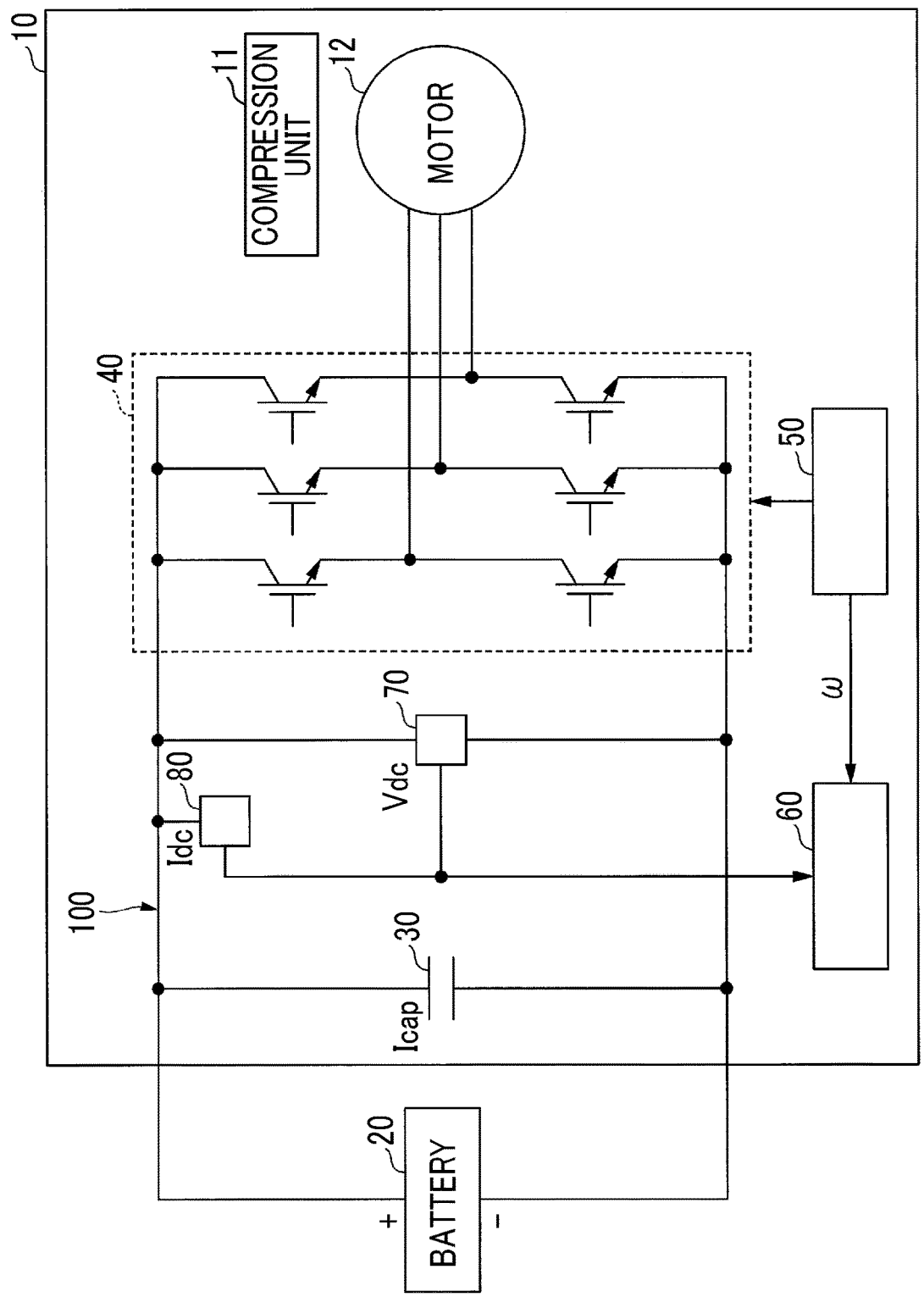
FIG. 2 is a diagram showing an example of the electric compressor in the embodiment of the present invention.

FIG. 2 is a diagram showing an example of the electric compressor in the embodiment of the present invention.

FIG. 2 shows a schematic configuration of the electric compressor 10 included in the air conditioner 2.

A battery 20 is a power supply unit mounted on the vehicle 3 (an outside of the air conditioner 2). The battery 20 supplies a high-pressure DC power to the electric compressor 10. The electric compressor 10 includes a control circuit 100, a compression unit 11, a motor 12, a controller 50, and a current estimating device 60. The control circuit 100 includes a capacitor 30, an inverter 40, a voltage detection circuit 70, and a current detection circuit 80. The inverter 40 and the motor 12 are connected to each other by a power line. A predetermined component included in the control circuit 100 and the controller 50 are connected to each other by a signal line. The inverter 40 converts the DC power supplied from the battery 20 into a three-phase AC and supplies the three-phase AC to the motor 12. In this way, the electric compressor 10 is driven by converting high-voltage DC power supplied from the power supply unit (battery 20) mounted on the vehicle 3 into three-phase AC power by the inverter 40 and applying the three-phase AC power to the motor 12. The inverter 40 is controlled by the controller 50. The controller 50 is constituted by an integrated circuit (IC) or the like, and controls the motor 12 via the inverter 40 based on a control signal acquired from the ECU 1 so that the motor 12 performs a desired operation. For example, the controller 50 controls a rotation speed ω of the motor 12. When the motor 12 is rotationally driven by an instruction from the inverter 40, the compression unit 11 compresses a refrigerant and supplies the refrigerant to a refrigerant circuit (not shown) included in the air conditioner 2.

The control circuit 100 includes the voltage detection circuit 70 and the current detection circuit 80. The voltage detection circuit 70 detects a DC voltage (inverter input voltage Vdc) input to the inverter 40. The current detection circuit 80 detects an input current (inverter input current Idc) of the inverter 40.

Meanwhile, it has been found that a value of a capacitor current Icap of the capacitor 30 can be ascertained in order to improve performance and control efficiency of the electric compressor 10 and to prevent a failure. Therefore, in the present embodiment, a method for estimating the capacitor current flowing through the capacitor 30 of the high-voltage circuit shown in FIG. 2 is provided. The current estimating device 60 of FIG. 2 is an estimation device of the capacitor current according to the present embodiment. The current estimating device 60 is connected to the voltage detection circuit 70, the current detection circuit 80, and the controller 50 through a signal line. The current estimating device 60 obtains the rotation speed ω of the motor 12, the input current value Idc of the inverter 40, and the input voltage value Vdc of the inverter 40 from these circuits or the like, and estimates the capacitor current Icap through a calculation. The controller 50 acquires the estimated capacitor current Icap and uses the estimated capacitor current Icap to control the electric compressor 10.

In FIG. 2, the current estimating device 60 is described as a device separated from the controller 50. However, the current estimating device 60 may be configured to be included in a portion of the controller 50.

Figure 3:
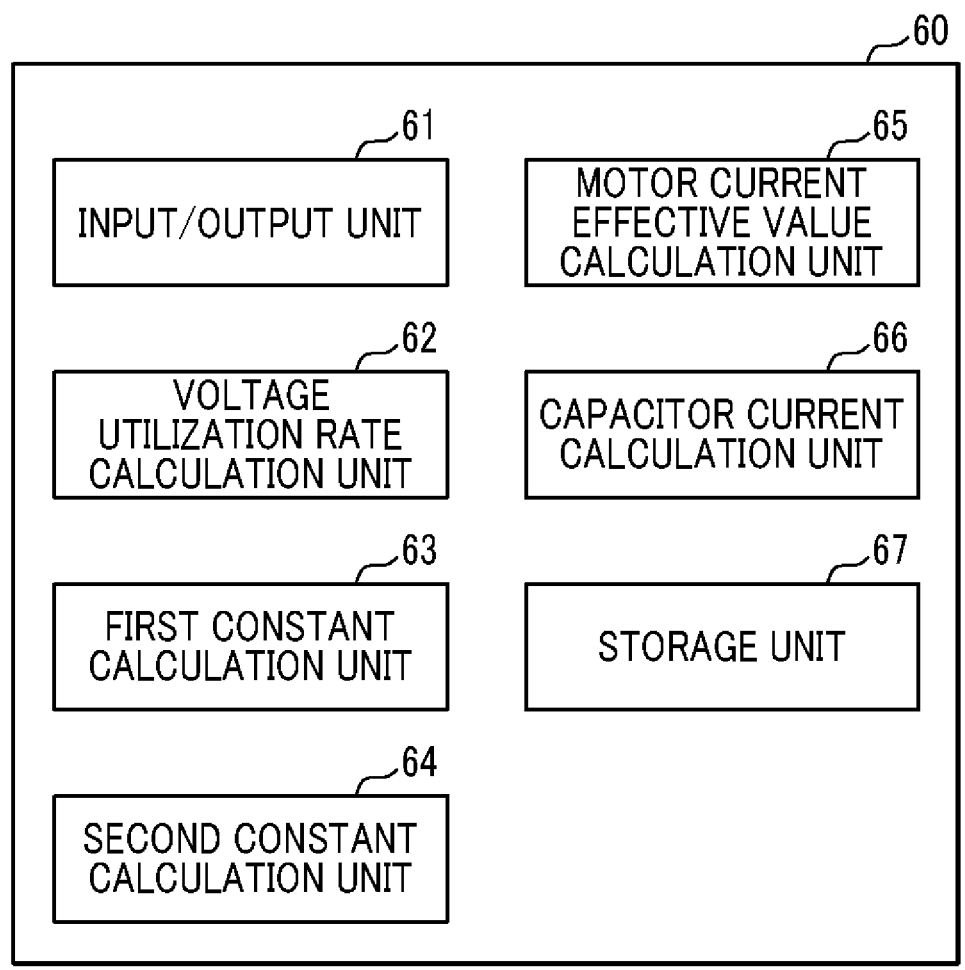
FIG. 3 is a functional block diagram showing an example of a current estimating device in the embodiment of the present invention.

FIG. 3 is a functional block diagram showing an example of a current estimating device in the embodiment of the present invention.

As shown in FIG. 3, the current estimating device 60 includes an input/output unit 61, a voltage utilization rate calculation unit 62, a first constant calculation unit 63, a second constant calculation unit 64, a motor current effective value calculation unit 65, a capacitor current calculation unit 66, and a storage unit 67. The input/output unit 61 acquires the inverter input current Idc, the inverter input voltage Vdc, and the rotation speed ω of the motor 12.

The voltage utilization rate calculation unit 62 calculates a voltage utilization rate Nv by the following Expression (3) using an induced voltage constant KE [Vrms/rpm], the rotation speed ω [rpm], and the inverter input voltage Vdc [V].

$$Nv = (KE \times \omega)/(Vdc/\sqrt{2}) \qquad (3)$$

The first constant calculation unit 63 applies the voltage utilization rate Nv calculated by the voltage utilization rate calculation unit 62 to the following Expression (4) (first calculation expression) and calculates a first constant α.

$$\alpha = A0 + (A1 \times Nv) + (A2 \times Nv^2) + (A3 \times Nv^3) + (A4 \times Nv^4) + (A5 \times Nv^5) + (A6 \times Nv^6) + (A7 \times Nv^7) + (A8 \times Nv^8) + (A9 \times Nv^9) + (A10 \times Nv^{10}) + \ldots + (An \times Nv^n) \qquad (4)$$

Here, A0, A1, ..., An are predetermined constants. Expression (4) can be represented by the following Equation.

$$\alpha = A0 + \sum_{i=1}^{n}(Ai \times Nv^i) \quad (4)$$

A specific example (n=10) of Expression (4) is shown below.

$$\alpha = A0 + (A1 \times Nv) + (A2 \times Nv^2) + (A3 \times Nv^3) + (A4 \times Nv^4) + (A5 \times Nv^5) + (A6 \times Nv^6) + (A7 \times Nv^7) + (A8 \times Nv^8) + (A9 \times Nv^9) + (A10 \times Nv^{10})$$

A0=1.2, A1=−7.6, A2=60.0, A3=−200, A4=460, A5=−500, A6=320.5, A7=0, A8=−106, A9=52.7, and A10=−8.5

As described above, A0 to An can be set so that a positive value and a negative value are alternately repeated between when a subscript is even and when a subscript is odd, thereby improving approximation accuracy of the first constant α. In addition, it has been confirmed that the approximation accuracy of the constant α is improved by setting a value of at least one (A7 in the example) of A0 to An to "0".

The second constant calculation unit 64 applies the voltage utilization rate Nv calculated by the voltage utilization rate calculation unit 62 to the following Expression (5) (second calculation expression) and calculates a second constant β.

$$\beta = B0 + (B1 \times Nv) + (B2 \times Nv^2) + (B3 \times Nv^3) + (B4 \times Nv^4) + (B5 \times Nv^5) + (B6 \times Nv^6) + (B7 \times Nv^7) + (B8 \times Nv^8) + (B9 \times Nv^9) + (B10 \times Nv^{10}) + \ldots + (Bm \times Nv^m) \quad (5)$$

Here, B0, B1, ..., Bm are predetermined constants. Expression (5) can be represented by the following Equation.

$$\beta = B0 + \sum_{j=1}^{m}(Bj \times Nv^j) \quad (5)$$

A specific example (m=10) of Expression (5) is shown below.

$$\beta = B0 + (B1 \times Nv) + (B2 \times Nv^2) + (B3 \times Nv^3) + (B4 \times Nv^4) + (B5 \times Nv^5) + (B6 \times Nv^6) + (B7 \times Nv^7) + (B8 \times Nv^8) + (B9 \times Nv^9) + (B10 \times Nv^{10})$$

B0=13.2, B1=−120, B2=600, B3=−1750, B4=2970, B5=−3000.2, B6=1430.8, B7=0, B8=−370, B9=170, and B10=−25

Similarly to the case of the first constant α, B0 to Bm can be set so that a positive value and a negative value are alternately repeated between when a subscript is even and when a subscript is odd, thereby improving approximation accuracy of the second constant β. In addition, it is confirmed that the approximation accuracy of the constant β is improved by setting a value of at least one (B7 in the example) of B0 to Bm to "0"

The motor current effective value calculation unit 65 multiplies the second constant β calculated by the second constant calculation unit 64 and the inverter input current Idc and calculates a motor current effective value Im [Arms]. Specifically, the motor current effective value calculation unit 65 calculates the motor current effective value Im through the following Expression (6).

$$Im = \beta \times Idc \quad (6)$$

The capacitor current calculation unit 66 multiplies the first constant α calculated by the first constant calculation unit 63 and the motor current effective value Im calculated by the motor current effective value calculation unit 65 to calculate the capacitor current Icap. Specifically, the capacitor current calculation unit 66 calculates the capacitor current effective value Icap according to the following Expression (7).

$$Icap = \alpha \times Im \quad (7)$$

The storage unit 67 stores the induced voltage constant KE and the constants such as A0 to An or B0 to Bm.

Next, a flow of capacitor current estimation processing of the present embodiment will be described.

FIG. 4 is a flowchart showing an example of current estimation processing in the embodiment of the present invention.

First, the input/output unit 61 acquires the inverter input voltage Vdc from the voltage detection circuit 70, the inverter input current Idc from the current detection circuit 80, and the rotation speed (o (command value) from the controller 50 (Step S11).

Next, the voltage utilization rate calculation unit 62 calculates the voltage utilization rate Nv according to Expression (3) (Step S12).

Next, the first constant calculation unit 63 calculates the first constant α according to Expression (4) (Step S13).

Meanwhile, the second constant calculation unit 64 calculates the second constant β according to Expression (5) (Step S14). If the second constant calculation unit 64 calculates the second constant β, the motor current effective value calculation unit 65 calculates the motor current effective value Im according to Expression (6) (Step S15).

Finally, the capacitor current calculation unit 66 calculates the capacitor current Icap according to Expression (7) (Step S16). Thereafter, for example, the input/output unit 61 outputs the capacitor current Icap to the controller 50. The controller 50 controls the inverter 40 using an estimation value of the capacitor current Icap.

According to the present embodiment, it is possible to estimate the capacitor current Icap only through the calculation based on information which can be acquired from the control circuit 100. Accordingly, the capacitor current Icap can be used to improve the performance of the electric compressor 10 or the like. Since it is not necessary to provide a sensor for detecting the capacitor current Icap, it is possible to prevent a cost increase. Since the electric compressor 10 is used for the in-vehicle air conditioner, high reliability is required for the electric compressor 10. Accordingly, if a sensor for detecting the capacitor current is provided in the electric compressor 10, reliability may decrease due to a failure of a sensor or the like. However, in the case of the current estimating device 60 of the present embodiment, since a sensor is not installed, there is little possibility of impairing reliability. From the viewpoint of a mounting space, it is required for the inverter integrated electric compressor used in the in-vehicle air conditioner to be compact. According to the current estimating method of the calculation of the present embodiment, it is possible to prevent a device from increasing in a size caused by the installation of the sensor.

For example, all or some functions of the current estimating device 60 may be realized by hardware configured by an integrated circuit such as a large scale integration (LSI). All or some functions of the current estimating device 60 may be constituted by a computer such as a microcomputer unit (MCU). In this case, for example, each process of processing in the current estimating device 60 can be realized by making a CPU included in the current estimating device 60 execute a program.

In addition, it is possible to appropriately replace components in the embodiment with known components within a scope which does not depart from the gist of the present invention. A technical scope of the present invention is not limited to the embodiment, and various modifications can be made within a scope which does not depart from the gist of the present invention.

In the embodiment, the case where the electric compressor 10 constitutes a portion of the car air conditioner of the vehicle 3 is described as an example. However, the electric compressor 10 can also be applied to an air conditioner of a freezer/refrigerated vehicle. A device to which the electric compressor 10 is applied may be an air conditioner mounted on various moving bodies such as a ship, an airplane, or a train, in addition to the vehicle. Even in this case, by incorporating the current estimating device 60 according to the present embodiment together with the controller of the electric compressor 10, the current of the capacitor provided in the high-voltage circuit of the motor 12 which drives the electric compressor 10 can be estimated and used to control the electric compressor 10.

A device in which only at least some of the functions (input/output unit 61, second constant calculation unit 64, motor current effective value calculation unit 65, storage unit 67) of the current estimating device 60 are mounted may be constituted and connected to the control circuit 100 shown in FIG. 2 so as to be used as a motor current effective value estimation device. The motor current effective value estimation device acquires the inverter input voltage Vdc, the inverter input current Idc, and the rotation speed ω, and estimates the motor current effective value Im according to Expression (4) (in the flowchart of FIG. 4, Steps S11, S12, S14, and S15 are performed).

INDUSTRIAL APPLICABILITY

According to the current estimating device, the electric compressor, the current estimating method, and the motor current effective value estimating method, it is possible to accurately estimate the capacitor current of the capacitor provided in the high-voltage circuit which drives the motor.

REFERENCE SIGNS LIST

1: ECU
2: air conditioner
10: electric compressor
11: compression unit
12: motor
20: battery
30: capacitor
40: inverter
50: controller
60: current estimating device
61: input/output unit
62: voltage utilization rate calculation unit
63: first constant calculation unit
64: second constant calculation unit
65: motor current effective value calculation unit
66: capacitor current calculation unit
67: storage unit

The invention claimed is:

1. A current estimating device for estimating a capacitor current of a high-voltage circuit which drives a motor, the device comprising:
a voltage utilization rate calculation unit which calculates a voltage utilization rate using an input voltage of an inverter included in the high-voltage circuit and a rotation speed of the motor;
a first constant calculation unit which applies the voltage utilization rate to a predetermined first calculation expression to calculate a first constant; and
a capacitor current calculation unit which multiplies the first constant by a motor current effective value of the motor to calculate a capacitor current of a capacitor included in the high-voltage circuit.

2. The current estimating device according to claim 1, wherein the first calculation expression is the following Equation (1) when n, A0, and Ai (i=1 to n) are predetermined constants, the first constant is $\alpha$, and the voltage utilization rate is Nv.

$$\alpha = AO + \sum_{i=1}^{n} (Ai \times Nv^j). \tag{1}$$

3. The current estimating device according to claim 1, further comprising:
a second constant calculation unit which applies the voltage utilization rate to a predetermined second calculation expression to calculate a second constant; and
a motor current effective value calculation unit which multiplies the second constant by an input current of the inverter to calculate the motor current effective value.

4. The current estimating device according to claim 3, wherein the second calculation expression is the following Equation (2) when m, B0, and Bj (j=1 to m) are predetermined constants, the second constant is $\beta$, and the voltage utilization rate is Nv.

$$\beta = BO + \sum_{j=1}^{m} (Bj \times Nv^j). \tag{2}$$

5. The current estimating device according to claim 2, further comprising:
a second constant calculation unit which applies the voltage utilization rate to a predetermined second calculation expression to calculate a second constant; and
a motor current effective value calculation unit which multiplies the second constant by an input current of the inverter to calculate the motor current effective value.

6. The current estimating device according to claim 5, wherein the second calculation expression is the following Equation (2) when m, B0, and Bj (j=1 to m) are predetermined constants, the second constant is $\beta$, and the voltage utilization rate is Nv.

$$\beta = BO + \sum_{j=1}^{m} (Bj \times Nv^j). \tag{2}$$

7. An electric compressor comprising the current estimating device according to claim 1.

8. A current estimating method for estimating a capacitor current of a high-voltage circuit which drives a motor, the method comprising:
- a step of calculating a voltage utilization rate using an input voltage of an inverter included in the high-voltage circuit and a rotation speed of the motor;
- a step of applying the voltage utilization rate to a predetermined first calculation expression to calculate a first constant; and
- a step of multiplying the first constant by a motor current effective value of the motor to calculate a capacitor current of a capacitor included in the high-voltage circuit.

9. A motor current effective value estimating method for estimating a motor current effective value of a high-voltage circuit which drives a motor, the method comprising:
- a step of calculating a voltage utilization rate using an input voltage of an inverter included in the high-voltage circuit and a rotation speed of the motor;
- a step of applying the voltage utilization rate to a predetermined second calculation expression to calculate a second constant; and
- a step of multiplying the second constant by an input current of the inverter to calculate the motor current effective value.

* * * * *